United States Patent [19]
Berglund et al.

[11] Patent Number: 6,145,438
[45] Date of Patent: *Nov. 14, 2000

[54] METHOD AND APPARATUS FOR DIRECT WRITING OF SEMICONDUCTOR DIE USING MICROCOLUMN ARRAY

[76] Inventors: C. Neil Berglund, 15361 S. Clackamas River Dr., Oregon City, Oreg. 97045; Tai-Hon Philip Chang, 1105 Nimitz La., Foster City, Calif. 94404

[*] Notice: This patent issued on a continued prosecution application filed under 37 CFR 1.53(d), and is subject to the twenty year patent term provisions of 35 U.S.C. 154(a)(2).

[21] Appl. No.: 09/045,490

[22] Filed: Mar. 20, 1998

[51] Int. Cl.[7] .......................... B41C 1/05; H01J 37/304; G03C 5/00
[52] U.S. Cl. ............................. 101/463.1; 250/491.1; 250/492.22; 430/296; 378/34; 378/35
[58] Field of Search ............... 101/463.1; 250/491.1, 250/492.22, 492.3; 430/296, 302; 438/982; 378/34, 35

[56] References Cited

U.S. PATENT DOCUMENTS

| | | | |
|---|---|---|---|
| 3,900,737 | 8/1975 | Collier et al. | 250/492 |
| 4,243,866 | 1/1981 | Pfeiffer et al. | 219/121 |
| 4,423,305 | 12/1983 | Pfeiffer | 250/491.1 |
| 4,469,950 | 9/1984 | Taylor et al. | 250/492.2 |
| 4,498,010 | 2/1985 | Biechler et al. | 250/492.2 |
| 4,568,861 | 2/1986 | Dorant et al. | 250/397 |
| 4,668,083 | 5/1987 | Akapeddi et al. | 335/100 |
| 4,694,178 | 9/1987 | Harte | 250/396 R |
| 4,818,885 | 4/1989 | Davis et al. | 250/491.1 |
| 5,103,101 | 4/1992 | Berglund et al. | 250/490.2 |
| 5,122,663 | 6/1992 | Chang et al. | 250/310 |
| 5,155,412 | 10/1992 | Chang et al. | 315/14 |
| 5,213,916 | 5/1993 | Milton et al. | 430/320 |
| 5,229,861 | 7/1993 | Nozaka et al. | 101/463.1 |
| 5,334,467 | 8/1994 | Cronin et al. | 430/5 |
| 5,393,987 | 2/1995 | Abboud et al. | 250/492.22 |
| 5,621,216 | 4/1997 | Clarke et al. | 250/492.22 |
| 5,837,423 | 11/1998 | Okamoto | 430/296 |
| 5,864,142 | 1/1999 | Muraki et al. | 250/491.1 |
| 5,869,354 | 2/1999 | Leedy | 438/110 |
| 5,874,198 | 2/1999 | Okino | 430/296 |

OTHER PUBLICATIONS

T.H.P Chang et al., "Electron beam technology—SEM to microcolumn". Microelectronic Engineering 32, (1996), pp. 113–130.

T.H.P. Chang et al., "Electron–beam microcolumns for lithography and related applications", J.Vac.Sci.Technol. B 14(6), Nov./Dec. 1996, pp. 3774–3781.

T.H.P. Chang et al., "Electron beam microcolumn technology and applications", Electron–Beam Sources and Charged–Particle Optics, SPIE vol. 2522, 1995, 10 pgs.

M.G.R. Thomson et al., "Lens and deflector design for microcolumns"J.Vac.Sci.Technol. B13(6), Nov. Dec. 1995, pp 2445–2449.

E. Kratschmer et al., "Experimental evaluation of a 20x20 mm footprint microcolumn", J. Vac. Sci. Technol. B 14(6), Nov/Dec 1996, pp. 3792–3796.

H.S. Kim et al., "Miniature Schottky electron source", J.Vac. Sci.Technol. B 13(6), Nov./Dec. 1995, pp. 2468–2472.

*Primary Examiner*—Eugene Eickholt

[57] ABSTRACT

In electron beam lithography, a lithography system uses multiple microcolumns in an array to increase throughput for direct writing of semiconductor wafers. The mismatch between the microcolumn array and the semiconductor die periodicity is resolved by using only one microcolumn to scan each individual die. This is accomplished by assuring that the stage carrying the semiconductor wafer moves a total distance in each of the X and Y directions which is greater than the pitch between adjacent die. Hence each die is scanned by only a single microcolumn although at possibly different times during the total stage motion.

24 Claims, 2 Drawing Sheets

METHOD AND APPARATUS FOR DIRECT WRITING OF SEMICONDUCTOR DIE USING MICROCOLUMN ARRAY

BACKGROUND OF THE INVENTION

1. Field of the Invention

This invention relates to lithography and more specifically to charged particle (e.g. electron beam) lithography using microcolumns to direct write images onto a wafer.

2. Description of the Prior Art

Most lithography now used for fabricating semiconductor devices uses light which passes through a mask, where the mask carries the image to be transferred to a photosensitive resist layer on a substrate. A second type of well known lithography is electron beam lithography. Instead of using light, this uses an electron beam (but no mask) to form an image on a substrate. The substrate is coated with a layer of resist sensitive to the incident electron beam. The resist in either case is then developed and the exposed areas then either remain or are removed, defining a pattern on a surface of the wafer. Subsequent steps etch away the exposed portions of the wafer surface to define semiconductor features.

To date, electron beam lithography has been used mostly to fabricate the masks rather than the semiconductor wafers. The masks themselves are then used in the photolithography, as disclosed above. However, it is also known to use electron beam lithography to direct write features onto a semiconductor wafer. Typically this is only used for low throughput systems where a small number of semiconductor chips are needed, since the direct write approach is relatively slow. Of course it has the advantage of eliminating the masks and also providing very small feature sizes (better resolution) due to the nature of the electron beams compared to the much longer wavelength light used in photolithography. Thus to date practical applications of high resolution electron beam lithography are typically limited to mask making and manufacturing of highly specialized integrated circuits, due to the low throughput and high equipment cost for electron beam lithography.

However, since the general trend in semiconductor fabrication is to reduce minimum feature size and there is an expectation of a minimum feature size below 100 nanometers in the next 10 years, photolithography is becoming increasingly expensive and may not offer sufficient resolving power. Minimum feature size is typically the minimum width of a portion of a transistor as defined the lithography process which in turn defines the overall size of the transistor and hence the number of transistors or other semiconductor devices which may be provided on a single integrated circuit.

While integrated circuits are typically called chips, at the wafer level and prior to packaging they are often referred to as die. That terminology is used herein to refer to a single semiconductor substrate which will later become a semiconductor integrated circuit. A typical semiconductor wafer contains many (for instance hundreds or thousands of) such die arranged in a grid.

Therefore while it has been widely recognized that electron beam lithography has possibilities for direct writing of mass production semiconductor wafers, so far this has not been commercially feasible.

Also known in the electron beam lithography field is a technology called microcolumns. A typical electron beam lithography machine has a single source of electrons, an associated accelerator (electrostatic) device for accelerating the electrons, and a set of elements which are typically coaxial electro-magnets for focusing the beam onto the substrate. However, it is known (see e.g. U.S. Pat. Nos. 5,155,412 and 5,122,663 to IBM and "Electron-beam microcolumns for lithography and related applications", incorporated herein by reference) to provide an array of so called microcolumns wherein each individual microcolumn is a complete electron beam column including an electron beam source, an accelerator or extractor electrode, a deflector electrode for scanning the beam, and a electrostatic lens for focusing the beam. Such microcolumns have a typical diameter of approximately 1 to 2 centimeters. A two dimensional array of such microcolumns has been proposed for lithography.

Also, while the disclosure herein is mostly directed to electron beam lithography, electrons of course are just one type of charge particles. Also known are ion beam sources which instead of emitting electrons emit other charged particles. Unlike an electron beam system, instead of merely requiring a source of electric current to the source, a source of atoms (a gas) must be provided. Hence such devices are generally slower in writing speed and more complicated than electron beam devices and so far have not been used commercially for lithography.

In any case, it would be desirable to provide a method of increasing throughput (production rates) in semiconductor fabrication using electron or ion beam technology so as to allow direct writing of semiconductor wafers for mass production of high volume integrated circuits. So far, this has not been feasible.

SUMMARY

While the use of an array of electron beam microcolumns for direct writing of semiconductor devices has been proposed, the present inventors have discovered certain problems therein. The general idea, as is well known, is to use multiple electron beam microcolumns to increase throughput as compared to an electron beam machine having only a single column. Since each microcolumn has the full complement of beam forming, beam deflection, and beam blanking capabilities of a conventional single column, well-established scanning electron beam writing techniques can be used in such a microcolumn machine. Typically, patterns are written over relatively narrow stripe of less or equal 100 μm in width and butted (connected) using a continuously moving stage which carries the semiconductor wafer. The position of the stage is controlled by laser interferometry as is conventional.

This type of writing using an array of microcolumns can use the well known MEBES raster scan writing approach currently used for making masks with a single electron beam column. See e.g. U.S. Pat. Nos. 4,818,885 to IBM and 4,668,083, and 3,900,737 to Bell Labs, incorporated herein by reference. Thus a basic system architecture in accordance with the present invention may include the basic data path and many other advanced techniques such as multi-path and multipixel techniques developed for MEBES. See U.S. Pat. Nos. 5,621,216 to IBM; 5,393,987 to Etec System Inc., and 5,103,101 to Etec Systems, Inc., incorporated herein by reference. Also, other well known electron beam lithography approaches such as using a gray scale or shaped beam can also be used; see e.g. U.S. Pat. Nos. 5,213,916 to IBM; 5,334,467 to IBM; 4,568,861 to IBM; 4,423,305 to IBM incorporated herein by reference.

However, the present inventors have determined that there is a significant problem using a microcolumn array to direct write semiconductor die on a semiconductor wafer. This is the problem of mismatch between the microcolumn array pitch and the die layout pitch.

The mismatch problem is that the microcolumn array has a pitch (center to center distance) between adjacent microcolumns in both dimensions of the array of e.g. 1 centimeter, where this is the typical diameter of the individual microcolumns including the housing of each microcolumn. Of course it is desirable in any one of such electron beam lithography machines to have the individual microcolumns rigidly fixed in relation to each other so as to maintain optimum alignment and accuracy. However, the individual die to be written by such a machine typically vary in size depending on the complexity of the circuitry on the die and other factors. Hence the fixed arrangement of the microcolumn array and the need to accommodate varying sizes of the die are problematic.

One obvious solution to this is to provide a mechanically adjustable array of microcolumns, whereby each microcolumn may be moved in both the X and Y directions (which is the plane defined by the substrate to be written) relative to one another. While this is theoretically possible, it is probably undesirable because of the very precise calibration and accuracy requirements.

However in accordance with the invention, the present inventors have developed a writing method and apparatus that solve this problem without requiring any particular mechanical or adjustment features, but instead use a particular writing approach. In accordance with this approach, suppose the array of microcolumns has a 1 centimeter pitch (center to center distance) while the die are on a 1.5 centimeter pitch. By assuring that the stage carrying the wafer moves a total distance (travel) greater than the die pitch in both directions (X and Y) rather than only moving a distance equal to the die pitch, then each die will always be covered completely in terms of being scanned (written to) by only a single microcolumn.

Of course, each particular die may be so covered at different times during the total stage motion of scanning the entire wafer. Therefore sometimes not every microcolumn will be used to scan a particular wafer, depending on the difference between the die pitch and the microcolumn pitch. Hence in accordance with the invention, there is some redundancy of microcolumns and a certain increase in printing time. However, this redundancy can be used to provide additional reliability in the microcolumn array since it will always be possible to select different subsets of the microcolumn array to write particular die sizes, perhaps at some additional throughput decrease.

DETAILED DESCRIPTION

Figure 1:
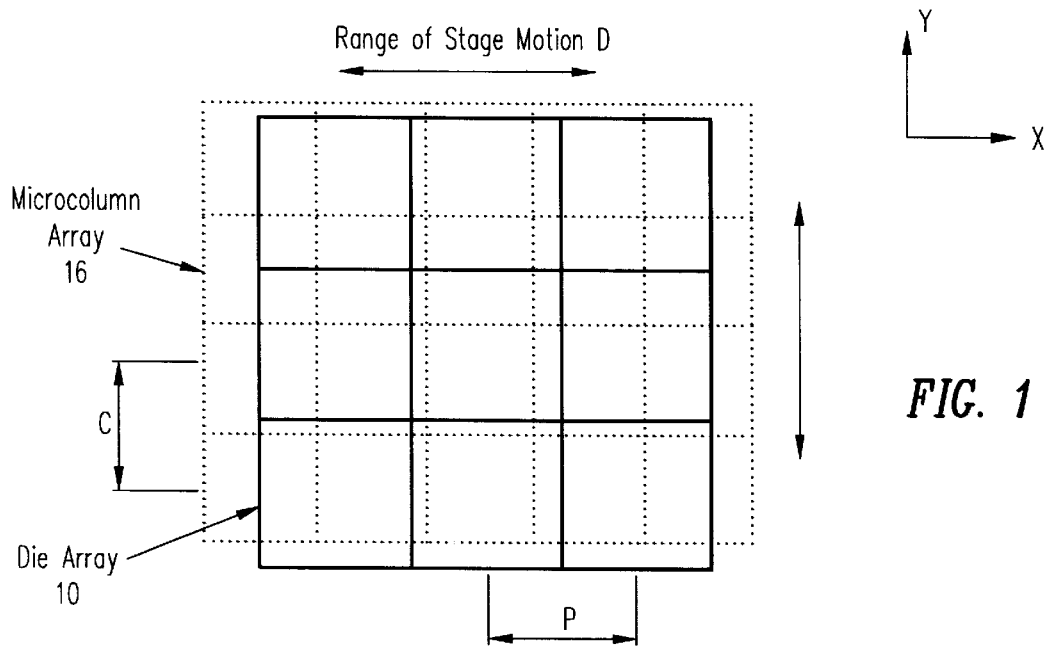
FIG. 1 shows diagrammatically the technical problem addressed by this invention and the solution.

The method in accordance with this invention and the problem it solves are both illustrated in FIG. 1 which shows diagrammatically a wafer substrate 10 (in plan view) on which there are a number of individual die shown by the solid black lines in an array. Of course a typical substrate includes hundreds or thousands of die rather than only nine as illustrated here; FIG. 1 is merely for purposes of conceptual explanation. It is to be understood that the die are merely particular areas on the substrate and are defined by the semiconductor features formed thereon. The substrate is later conventionally scribed (sawn apart) along the dark lines.

In this example, the individual die are squares each measuring 1.5 centimeter by 1.5 centimeter in respectively the X and Y axis directions, thus having a 1.5 centimeter pitch P. In contrast, the microcolumn array 16 (which is shown here only in terms of the areas to be imaged by each microcolumn), includes a number of microcolumns (dotted lines) which are arrayed so that they are placed on a 1 centimeter pitch C. Each individual microcolumn area shown by the dotted lines measures only 1 centimeter by 1 centimeter. Hence there is obviously a mismatch between the periodicity between the microcolumn array 16 and the die array on wafer 10.

As described above, in accordance with this invention an array of microcolumns 16 can be scanned over a different sized array of die on wafer 10 while assuring that each individual die is scanned by only one microcolumn. This is done by simply assuring that the stage carrying the wafer 10 moves a total distance (travel) of D in this case, for instance 2 centimeters, which is a distance greater than the die pitch P, in each of the X and Y directions for each stage movement rather than only 1.5 centimeters. Thus each and every die area will always be covered completely by only one microcolumn for scanning. Of course, possibly portions of each individual die will be scanned at different times during the total stage motion.

Thus in this case the microcolumns have an exemplary pitch of C of 1 centimeter, the die pitch P is 1.5 centimeters, and the total stage movement D in each direction for each movement of the stage is 2 centimeters. Of course these dimensions are merely exemplary. The key factor is that the total range of motion D of the stage in each of the X and Y directions is greater than the microcolumn pitch in that direction. Therefore in accordance with the invention this achieves the result that each individual die area is written by only a single microcolumn, rather than by multiple microcolumns as would be the situation if the stage range of movement was otherwise. This method has the disadvantage that not every microcolumn will be used in such a scanning approach, depending on the difference between the die size and the microcolumn array periodicity. Also of course there is some reduction in throughput due to the relatively inefficient use of the microcolumns.

By using this method to accommodate differences between the microcolumn array and the die periodicity, a fixed microcolumn array size can be used. Hence one lithography machine ("tool") with a fixed array of microcolumns can be used to pattern wafers having a variety of die sizes.

Figure 2:
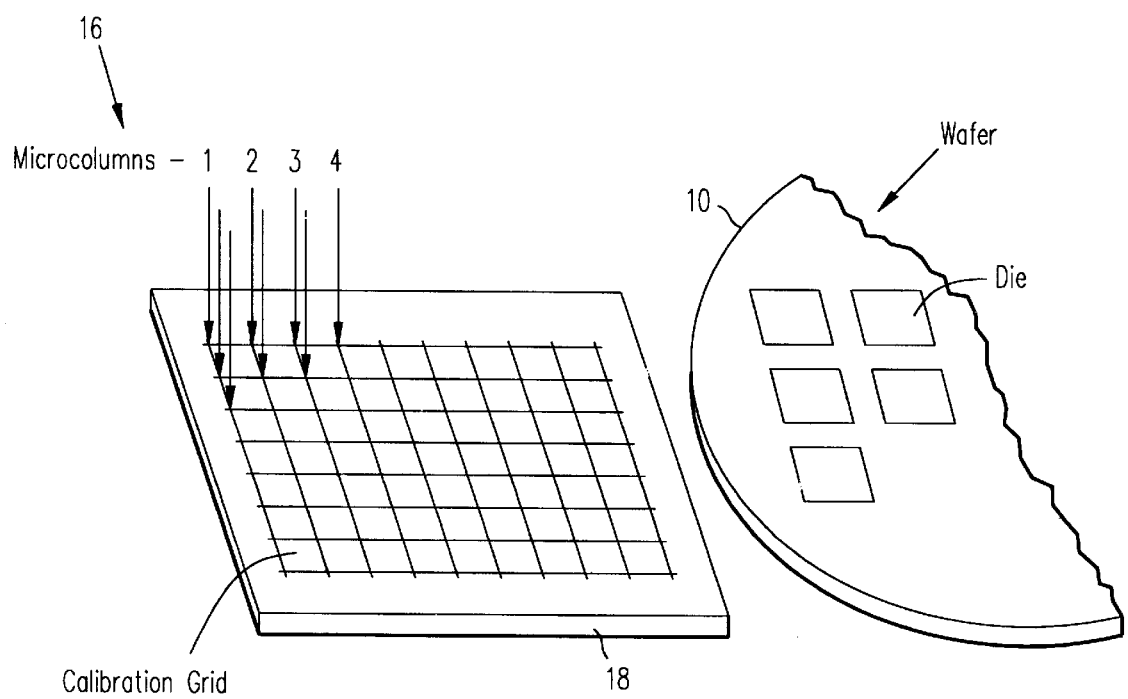
FIG. 2 shows alignment in accordance with the invention.

However, before the actual patterning process, an accurate calibration of the beam position in each column and the scan width (or stripe width) is performed. This is accomplished by the aid of a very accurate calibration grid 18 as shown in FIG. 2 with periodicity matching that of the fixed column-array 16. The grid 18 is placed at the same height as the wafer 10, and can be incorporated into the stage (not shown) that carries the wafer 10 or be inserted as needed into the system. The grid 18 is fabricated with suitable topography and/or material to allow an adequate secondary or reflected electron signal to be generated. The calibration process involves each column 16 scanning the grid 18, and the signals so derived allow the beam position and scan width of each column 16 to be properly adjusted.

Figure 3:
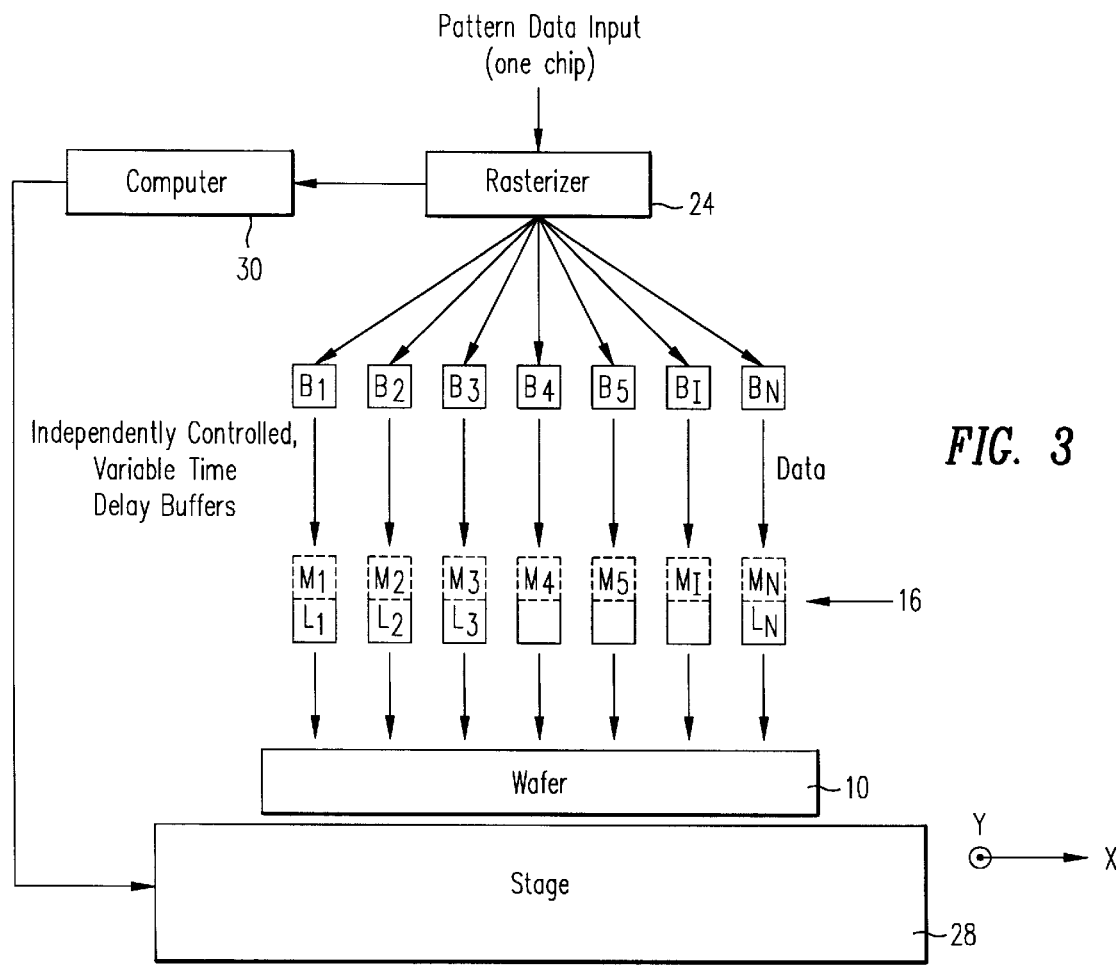
FIG. 3 shows diagrammatically data processing and control of the microcolumns and stage in accordance with this invention.

Referring back to FIG. 1, in the usual case, an identical pattern is to be imaged onto each individual die. In this case the writing method is such that each field (a portion of the die pattern) for each die is written in exactly the same manner except for the timing of the data supplied to the individual die areas of FIG. 1. Hence FIG. 3 shows a simplified graphic representation of the data path for a microcolumn array direct write tool which writes one die per microcolumn. It is to be understood that the actual lithography tool is basically a multiple microcolumn electron beam lithography tool of the type known in the art; one element changed here is the control program for providing the data (which defines the pattern to be written) to the individual microcolumns and for controlling the stage movement.

Hence in one embodiment the invention is partially embodied in computer software which is part of the program used to control the lithography tool. The lithography tool may be of the MEBES type except having an array of microcolumns. FIG. 3 shows the pattern data which is conventionally for a single die (chip) provided to the rasterizer 24 which is either conventional electronic hardware or a computer program running on the computer or microprocessor (not shown) which controls the lithography tool. The rasterizing 24 process itself is essentially conventional of the type used in the well known MEBES technology. The rasterizer 24 then feeds the rasterized pattern data to each of a variety of independently controlled variable time delay buffers B1 through BN. There is one such buffer for each microcolumn in the microcolumn array 16; the microcolumns are therefore designated in FIG. 3 M1 through MN. The actual microcolumns are typically arranged in a two dimensional array but this is of course not limiting.

The variable time delay buffers B1 through BN are such that the time delay provided by each buffer is set by the system independent of the rasterizer 24. The rasterizer 24 thereby drives all of the microcolumns M1 through MN and it rasterizes only a single pattern which is the pattern desired to be written on each individual die. Further the data stream provided to each microcolumn M1 through MN is independent of the microcolumn alignment, again with the exception of the timing differences as provided by the buffers B1 through BN.

Thus this data path is designed on an individual die basis rather than a full wafer basis. This is a significant simplification compared to what is now used for microcolumn systems where "stitching" between microcolumn patterns is inherent. (Stitching here is the process whereby more than one column writes a single die.) In accordance with this invention, no such stitching is needed because each individual die is patterned by only a single microcolumn.

As shown in FIG. 3, each microcolumn M1 through MN receives exactly the same data, but the buffers B1 through BN allow timing variations for the writing action by each microcolumn. This delay compensates for the difference in periodicities illustrated in FIG. 1 when one particular microcolumn is over a particular portion of its die, the adjacent microcolumn will be over a different portion of its die. Hence the delay buffers B1 through BN correct for this. The electron beams E1, . . . , EN are emitted from microcolumns M1, . . . , MN respectively and blanked, deflected, etc. by conventional elements in each microcolumn. Each microcolumn also includes a conventional electron magnetic lens L1, . . . , LN in one version. The electron beams are incident on wafer 10 which is supported on movable stage 28. Movement of stage 28 in the X,Y,Z axes is controlled as described above by e.g. computer (or controller) 30 which is coupled to rasterizer 24. It is to be understood that FIG. 3 is a high level block diagram. However given this description, one of ordinary skill in the art can write a suitable computer program or design a suitable hardware rasterizer to carry out the method described herein.

This description is illustrative but not limiting; further modifications will be apparent to one skilled in the art in light of this disclosure and are intended to fall within the scope of the appended claims.

We claim:

1. A method of imaging a pattern on a substrate, the pattern defining a plurality of die on the substrate, there being a pitch P between adjacent die, using an array of charged particle beam columns, comprising:

moving the substrate in two perpendicular directions while blanking the charged particle beams on and off, thereby scanning the pattern onto the substrate;

wherein a total distance D the substrate is moved in each of the two directions for each movement in either of the two directions is greater than P, so that only one column images each of the die in the pattern.

2. The method of claim 1, further comprising, for each column, individually forming the beam, deflecting the beam, and blanking the beam on and off.

3. The method of claim 1, further comprising operating each of the particle beams at a plurality of intensities.

4. The method of claim 1, further comprising shaping the beams.

5. The method of claim 1, wherein the moving comprises scanning the pattern in a multipass or multipixel format.

6. The method of claim 1, wherein the array of columns has a pitch C between adjacent microcolumns, and C is less than P.

7. The method of claim 1, wherein a width of the beam from each column at the substrate surface is less than 100 $\mu$m.

8. The method of claim 6, wherein D=2 C.

9. The method of claim 1, further comprising:

providing a grid having a periodicity matching that of the array of columns; and aligning the array of columns relative to the substrate using the grid.

10. The method of claim 1, wherein during the scanning of the pattern onto the substrate, at least one of the columns is not used.

11. The method of claim 2, wherein each column is an electron beam microcolumn.

12. The method of claim 1, further comprising variably delaying provision of data defining the pattern to each of the columns.

13. The lithography apparatus for imaging a pattern onto a substrate, the pattern defining a plurality of die on the substrate, there being a pitch P between adjacent die, comprising:

an array of charged particle beam columns arranged to each direct a charged particle beam onto the substrate to define the pattern, each column including an individually controlled beam blanker;

a support for the substrate, the support being movable in two perpendicular directions for scanning the pattern onto the substrate; and a control coupled to the stage for controlling the stage movement, wherein the control moves the stage a total distance D in each of the two directions for each movement in either of the two directions, where D is greater than P, so that only one column images each of the die in the pattern.

14. The apparatus of claim 13, each column further including an individually controlled beam deflector.

15. The apparatus of claim 13, each column further including a gray scale beam intensity control.

16. The apparatus of claim 13, each column including a beam shaper.

17. The apparatus of claim 13, wherein the control moves the stage and controls the beams so as to scan the pattern in a multipass or multipixel format.

18. The apparatus of claim 13, wherein the array of columns has a pitch C between adjacent columns and C is less than P.

19. The apparatus of claim 13, wherein a width of the beam from each column at the substrate surface is less than 100 $\mu$m.

20. The apparatus of claim 18, wherein D=2 C.

21. The apparatus of claim 13, further comprising:
a grid having the same periodicity as the array of columns and located on the support; and
means for aligning the array of columns relative to the substrate using the grid.

22. The apparatus of claim 13, wherein during the scanning of the pattern at least one of the columns is not used.

23. The apparatus of claim 13, wherein each of the columns is an electron beam microcolumn.

24. The apparatus of claim 13, further comprising a variable delay buffer coupled to provide data defining the pattern to each column.

* * * * *